(12) United States Patent
Reznicek

(10) Patent No.: US 10,256,301 B1
(45) Date of Patent: Apr. 9, 2019

(54) NANOSHEET ISOLATED SOURCE/DRAIN EPITAXY BY SURFACE TREATMENT AND INCUBATION DELAY

(71) Applicant: International Business Machines Corporation, Armonk, NY (US)

(72) Inventor: Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/873,469

(22) Filed: Jan. 17, 2018

(51) Int. Cl.
| | |
|---|---|
| *H01L 29/06* | (2006.01) |
| *H01L 27/092* | (2006.01) |
| *H01L 21/3065* | (2006.01) |
| *H01L 21/265* | (2006.01) |
| *H01L 29/167* | (2006.01) |
| *H01L 21/311* | (2006.01) |
| *H01L 29/08* | (2006.01) |
| *H01L 21/223* | (2006.01) |
| *H01L 29/66* | (2006.01) |
| *H01L 29/423* | (2006.01) |
| *H01L 29/78* | (2006.01) |
| *H01L 21/02* | (2006.01) |

(Continued)

(52) U.S. Cl.
CPC ......... *H01L 29/0673* (2013.01); *H01L 21/02* (2013.01); *H01L 21/0262* (2013.01); *H01L 21/02532* (2013.01); *H01L 21/2236* (2013.01); *H01L 21/26513* (2013.01); *H01L 21/3065* (2013.01); *H01L 21/30604* (2013.01); *H01L 21/31116* (2013.01); *H01L 21/823814* (2013.01); *H01L 21/823821* (2013.01); *H01L 21/823828* (2013.01); *H01L 27/0924* (2013.01); *H01L 29/0847* (2013.01); *H01L 29/167* (2013.01); *H01L 29/42392* (2013.01); *H01L 29/6656* (2013.01); *H01L 29/66545* (2013.01); *H01L 29/66553* (2013.01); *H01L 29/66636* (2013.01); *H01L 29/66795* (2013.01); *H01L 29/785* (2013.01)

(58) Field of Classification Search
CPC ............... H01L 21/02; H01L 21/0262; H01L 21/02532; H01L 21/2236; H01L 21/26513; H01L 21/30604; H01L 21/3065; H01L 21/31116; H01L 21/823821; H01L 21/823814; H01L 21/823828
USPC ....................................................... 257/327
See application file for complete search history.

(56) References Cited

U.S. PATENT DOCUMENTS

| | | | |
|---|---|---|---|
| 2015/0054029 A1* | 2/2015 | Jangjian | H01L 29/4966 257/190 |
| 2015/0102386 A1* | 4/2015 | Chen | H01L 21/823431 257/192 |

(Continued)

*Primary Examiner* — Chuong A Luu
(74) *Attorney, Agent, or Firm* — L. Jeffrey Kelly; Ryan, Mason & Lewis, LLP

(57) ABSTRACT

A semiconductor device includes a plurality of stacked structures spaced apart from each other on a substrate, wherein the plurality of stacked structures each comprise a plurality of gate layers and a plurality of channel layers, a plurality of arsenic implanted regions on portions of a surface of the substrate adjacent the plurality of stacked structures, and a plurality of epitaxial source/drain regions extending from the plurality of stacked structures, wherein the plurality of epitaxial source/drain regions are spaced apart from the plurality of arsenic implanted regions.

16 Claims, 5 Drawing Sheets

(51) Int. Cl.
*H01L 21/306* (2006.01)
*H01L 21/8238* (2006.01)

(56) References Cited

U.S. PATENT DOCUMENTS

2015/0340302 A1* 11/2015 Chen .................. H01L 23/3171
257/190
2017/0278971 A1* 9/2017 Chen ............... H01L 21/823431

* cited by examiner

US 10,256,301 B1

NANOSHEET ISOLATED SOURCE/DRAIN EPITAXY BY SURFACE TREATMENT AND INCUBATION DELAY

BACKGROUND

Nanosheet devices can be viable device options instead of fin field-effect transistors (FinFETs). For example, nanowires or nanosheets can be used as the fin structure in a dual-gate, tri-gate or gate-all-around (GAA) FET device. Complementary metal-oxide semiconductor (CMOS) scaling can be enabled by the use of stacked nanowires and nanosheets, which offer superior electrostatics and higher current density per footprint area than FinFETs. Additionally, nanosheet devices are being pursued as a viable device option for the 5 nm node and beyond. Nanosheet formation relies on the selective removal of one semiconductor (e.g., Si) with respect to another (SiGe) to form the nanosheet and GAA structures. However, in existing approaches, the epitaxy grows bottom-up and from the nanosheets at the side walls, creating a parasitic device under the nanosheet stack. Accordingly, there is a need for avoiding such bottom-up epitaxial growth of nanosheet source/drain regions.

SUMMARY

According to an exemplary embodiment of the present invention, a method for manufacturing a semiconductor device includes forming a stacked configuration of silicon germanium and silicon layers on a semiconductor substrate, wherein the stacked configuration comprises a repeating arrangement of a silicon layer stacked on a silicon germanium layer, patterning the stacked configuration into a plurality of patterned stacks spaced apart from each other, etching exposed sides of the silicon germanium layers to remove portions of the silicon germanium layers from lateral sides of each of the silicon germanium layers, covering, with a dielectric, exposed sides of the silicon layers, exposed sides of remaining portions of the silicon germanium layers, and portions of a surface of the semiconductor substrate adjacent the patterned stacks, removing the dielectric from the portions of the surface of the semiconductor substrate, implanting arsenic on the portions of the surface of the semiconductor substrate to form a plurality of arsenic implanted regions on the portions of the surface of the semiconductor substrate, etching the dielectric to expose lateral sides of each of the silicon layers in the plurality of patterned stacks, and growing a plurality of epitaxial source/drain layers adjacent the plurality of patterned stacks, wherein the epitaxial source/drain layers are grown from the exposed lateral sides of the silicon layers.

According to an exemplary embodiment of the present invention, a semiconductor device includes a plurality of stacked structures spaced apart from each other on a substrate, wherein the plurality of stacked structures each comprise a plurality of gate layers and a plurality of channel layers, a plurality of arsenic implanted regions on portions of a surface of the substrate adjacent the plurality of stacked structures, and a plurality of epitaxial source/drain regions extending from the plurality of stacked structures, wherein the plurality of epitaxial source/drain regions are spaced apart from the plurality of arsenic implanted regions.

According to an exemplary embodiment of the present invention, a method for manufacturing a semiconductor device includes forming a stacked configuration of first and second semiconductor layers on a semiconductor substrate, wherein the stacked configuration comprises a repeating arrangement of a second semiconductor layer stacked on a first semiconductor layer, patterning the stacked configuration into a plurality of patterned stacks spaced apart from each other, covering, with a dielectric, exposed sides of the plurality of patterned stacks, and portions of a surface of the semiconductor substrate adjacent the patterned stacks, removing the dielectric from the portions of the surface of the semiconductor substrate, implanting an impurity on the portions of the surface of the semiconductor substrate to form a plurality of implanted regions on the portions of the surface of the semiconductor substrate, wherein the plurality of implanted regions at least one of delay and prevent epitaxial growth from the portions of the surface of the semiconductor substrate, etching the dielectric to expose lateral sides of each of the second semiconductor layers in the plurality of patterned stacks, and growing a plurality of epitaxial source/drain layers adjacent the plurality of patterned stacks, wherein the epitaxial source/drain layers are grown from the exposed lateral sides of the second semiconductor layers.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
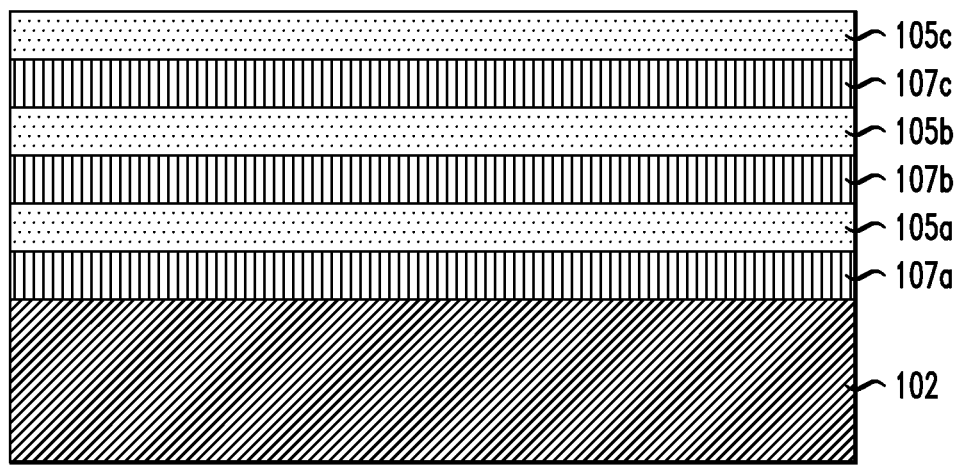
FIG. 1 is a schematic cross-sectional view illustrating manufacturing of a transistor device and showing formation of a stacked structure of silicon (Si) and silicon germanium (SiGe) nanosheet layers on a semiconductor substrate, according to an embodiment of the invention.

Exemplary embodiments of the invention will now be discussed in further detail with regard to semiconductor devices and methods of manufacturing same and, in particular, to preventing bottom-up epitaxial growth of source/drain regions from a substrate using surface poisoning and incubation delay.

It is to be understood that the various layers and/or regions shown in the accompanying drawings are not drawn to scale, and that one or more layers and/or regions of a type commonly used in, for example, complementary metal-oxide semiconductor (CMOS), field-effect transistor (FET), nanowire FET, nanosheet FET, fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, CMOSs, MOSFETs, nanowire FETs, nanosheet FETs and/or FinFETs. By way of non-limiting example, the semiconductor devices can include, but are not limited to FET, CMOS, MOSFET, nanowire FET, nanosheet FET and FinFET devices, and/or semiconductor devices that use FET, CMOS, MOSFET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Embodiments of the present invention relate to methods and structures wherein a surface layer of arsenic is formed on a substrate, at the bottom of the source/drain region. As further detailed herein, the surface layer of arsenic forms an epitaxy nucleation inhibition layer, creating an incubation delay and therefore inhibiting epitaxial growth from that layer. Such a structure will only allow epitaxial growth from the exposed nanosheet sidewalls, and thus avoid a parasitic device from forming at the bottom of the nanosheet stack.

Although embodiments of the present invention are discussed in connection with nanosheet stacks, the embodiments of the present invention are not necessarily limited thereto, and may similarly apply to nanowire stacks.

FIG. 1 is a schematic cross-sectional view illustrating manufacturing of a transistor device and showing formation of a stacked structure of silicon (Si) and silicon germanium (SiGe) nanosheet layers on a semiconductor substrate, according to an embodiment of the invention. As depicted in FIG. 1, a semiconductor substrate 102 comprises semiconductor material including, but not limited to, silicon (Si), silicon germanium (SiGe), II-V compound semiconductor or other like semiconductor. In addition, multiple layers of the semiconductor materials can be used as the semiconductor material of the substrate. In accordance with an embodiment of the present invention, the substrate 102 comprises a bulk silicon substrate.

Layers of silicon germanium 107a, 107b and 107c and silicon 105a, 105b and 105c are epitaxially grown in an alternating and stacked configuration on the substrate 102, so that a first SiGe layer 107a is followed a first Si layer 105a on the first SiGe layer 107a, which is followed by a second SiGe layer 107b on the first Si layer 105a, and so on. While three Si layers 105a-c and three SiGe layers 107a-c are shown, the embodiments of the present invention are not necessarily limited to the shown number of layers 105, 107, and there may be more or less layers in the same alternating configuration depending on design constraints.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a PECVD apparatus. A number of different sources may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. The temperature for epitaxial deposition typically ranges from 450° C. to 900° C. Although higher temperature typically results in faster deposition, the faster deposition may result in crystal defects and film cracking. By "in-situ" it is meant that the dopant that dictates the conductivity type of the doped layer is introduced during the process step, e.g., epitaxial deposition, which forms the doped layer.

As noted, in a non-limiting illustrative embodiment, SiGe layers 107a-107c of a SiGe/Si nanosheet stack are formed on the substrate 102 and intervening Si layers by epitaxial growth. Alternative materials may be used that have the property of being removed selectively compared to the nanosheet channel material, which, according to an embodiment, is silicon (e.g., layers 105a-105c).

In a non-limiting illustrative embodiment, a height of the layers 107a, 107b and 107c can be in the range of about 6 nm-about 10 nm depending on the application of the device. Also, in a non-limiting illustrative embodiment, silicon layers 105a-105c of the SiGe/Si nanosheet stack can be formed on SiGe layers 107a-107c by epitaxial growth. In accordance with an embodiment of the present invention, the layers 105a-105c can include the same or a similar composition to the substrate 102. In a non-limiting example, a height of the layers 105a-105c can be in the range of about 6 nm-about 15 nm depending on the desired process and application. In accordance with an embodiment of the present invention, each of the layers 105a-105c has the same or substantially the same composition and size as each other, and each of the layers 107a-107c has the same or substantially the same composition and size as each other.

Figure 2:
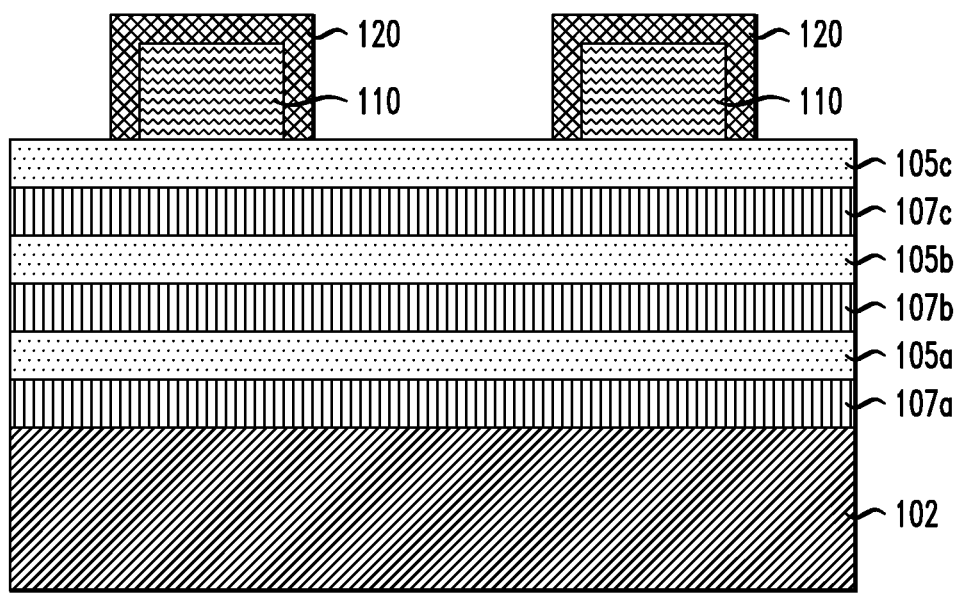
FIG. 2 is a schematic cross-sectional view illustrating manufacturing of a transistor device and showing formation of dummy gates and spacers, according to an embodiment of the invention.

FIG. 2 is a schematic cross-sectional view illustrating manufacturing of a transistor device and showing formation of dummy gates and spacers, according to an embodiment of the invention. As depicted in FIG. 2, dummy gate material 110, including, but not necessarily limited to, polysilicon, amorphous silicon, or a dielectric material such as, for example, oxide or silicon nitride, is deposited on and around the stacked configuration of Si and SiGe using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating, followed by a planarization process, such as, chemical mechanical polishing (CMP), and lithography and etching steps to remove excess dummy gate material, and pattern the deposited layers into dummy gates 110 corresponding to what is to become device gate regions.

Spacer layers 120 are formed on top of the dummy gates 110, which can be formed by one or more of the deposition techniques noted in connection with deposition of the dummy gate material. The spacer material can comprise for example, one or more dielectrics, including, but not necessarily limited to, silicon oxide, silicon nitride, silicon oxynitride, boron nitride, silicon boron nitride, or multilayered stacks thereof. According to an example embodiment of the invention, the spacer layers 120 are deposited on sidewalls and top surfaces of the dummy gates 110.

Figure 3:
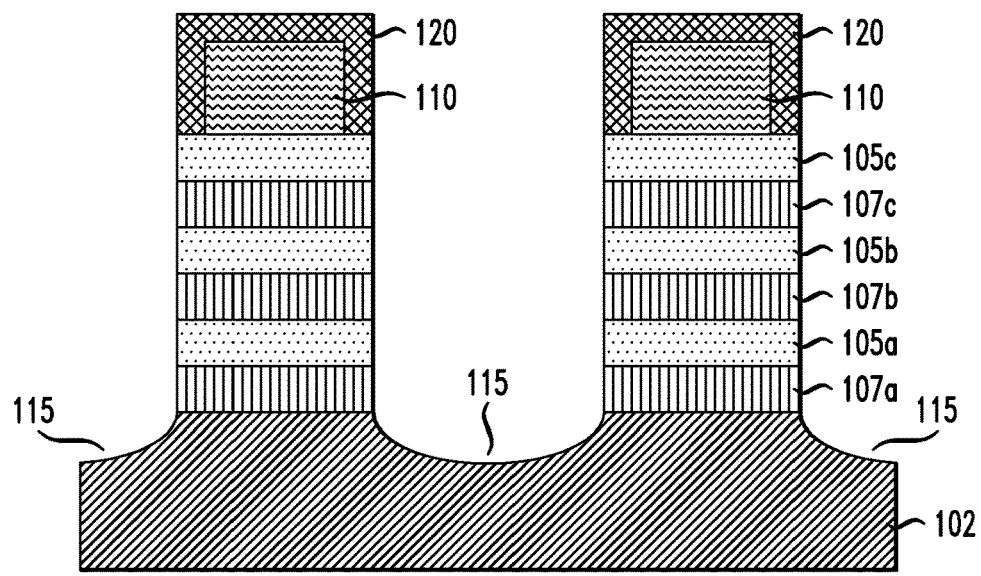
FIG. 3 is a schematic cross-sectional view illustrating manufacturing of a transistor device and showing patterning of the stacked nanosheet layers, according to an embodiment of the invention.

FIG. 3 is a schematic cross-sectional view illustrating manufacturing of a transistor device and showing patterning of the stacked nanosheet layers, according to an embodiment of the invention. Referring to FIG. 3, exposed portions of the stacked nanosheet layers, which are not under the spacer and dummy gate layers 120 and 110, are removed using, for example, an etching process, such as reactive ion etching (ME). As can be seen in FIG. 3, the portions of the stacked nanosheets or nanowires under the spacer layers 120 and under the dummy gates 110 remain after the etching process, and portions of the stacked nanosheets or nanowires in areas that correspond to source/drain regions are removed. In addition, referring to FIG. 3, portions of the substrate 102 are etched during the patterning to form recessed portions 115 in the substrate 102. In a non-limiting illustrative example, a depth of the recessed portions is about 10 nm to about 25 nm. Alternatively, the embodiments of invention can also apply to a situation where remaining portions of the substrate 102 after the patterning are flat (e.g., planar), and not recessed.

Figure 4:
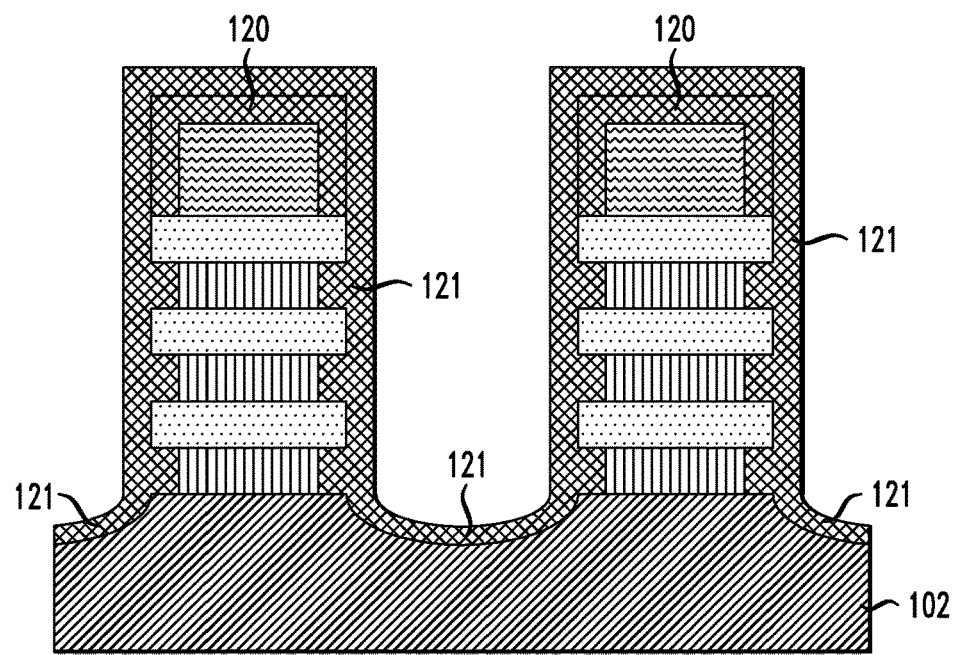
FIG. 4 is a schematic cross-sectional view illustrating formation of an inner spacer/liner layer, according to an embodiment of the invention.

FIG. 4 is a schematic cross-sectional view illustrating formation of an inner spacer/liner layer, according to an embodiment of the invention. As depicted in FIG. 4, the inner spacer/liner layer 121, is deposited on top and side surfaces of the nanosheet stacks, as well on exposed surfaces of the substrate 102, including in the recessed portions 115. In accordance with an embodiment, the inner spacer/liner layer 121 can comprise the same material as the spacer layer 120, such as, but not necessarily limited to, a nitride, like silicon nitride (SiN). Alternatively, the inner spacer/liner layer 121 can comprise a different material from that of the spacer layer 120.

As shown in FIG. 4, due to the germanium in layers 107a-107c, lateral etching of the layers 107a-107c can be performed selective to layers 105a-105c, such that the side portions of the SiGe layers 107a-107c can be removed, while maintaining the side portions of layers 105a-105c. Such etching can be performed using, for example, $NH_4OH:H_2O_2$ solution.

In accordance with an embodiment of the present invention, the vacant portions left by removal of the side portions of the layers 107a-107c are filled in by portions of the inner spacer/liner layer 121 formed on side surfaces of the nanosheet stacks. Deposition of the inner spacer/liner layer 121 can be performed using deposition techniques including, but not necessarily limited to, CVD, PECVD, RFCVD, PVD, ALD, MBD, PLD, and/or LSMCD, and/or sputtering.

Figure 5:
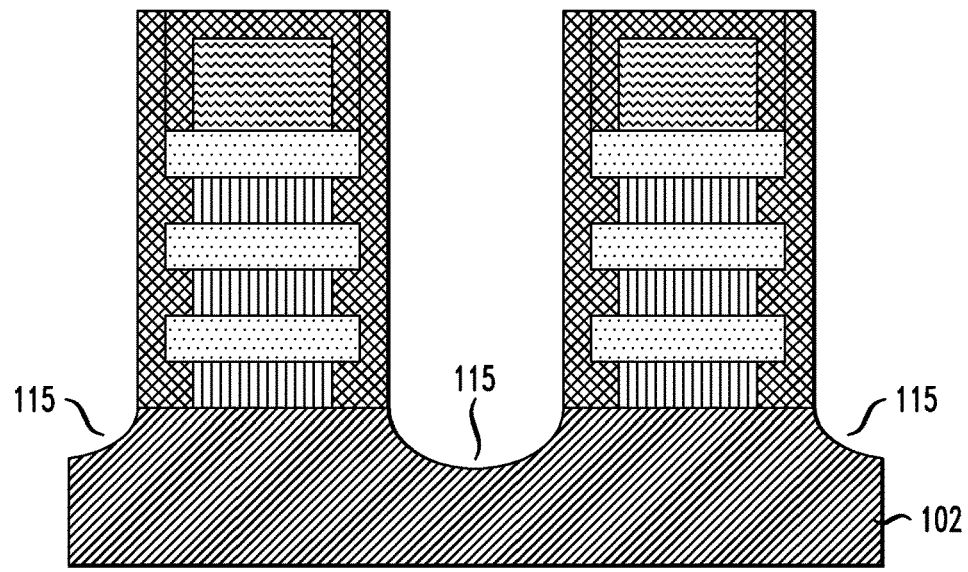
FIG. 5 is a schematic cross-sectional view illustrating directional removal of bottom portions of the inner spacer/liner layer on the substrate, according to an embodiment of the invention.

FIG. 5 is a schematic cross-sectional view illustrating directional removal of bottom portions of the inner spacer/liner layer on the substrate, according to an embodiment of the invention. As depicted in FIG. 5, the inner spacer/liner layer 121 is removed from horizontal or approximately horizontal surfaces, including from the top of the spacer layer 120 on the nanosheet stacks and from the recessed portions 115 of the substrate 102, thereby exposing portions of the substrate 102, while keeping the sidewalls of the SiGe/Si stacks covered by the inner spacer/liner layer 121. In a non-limiting illustrative example, at least one embodiment of the invention includes using a removal process, such as a gas cluster ion beam (GCIB) process to perform the directional removal of the portions of the inner spacer/liner layer 121.

Figure 6:
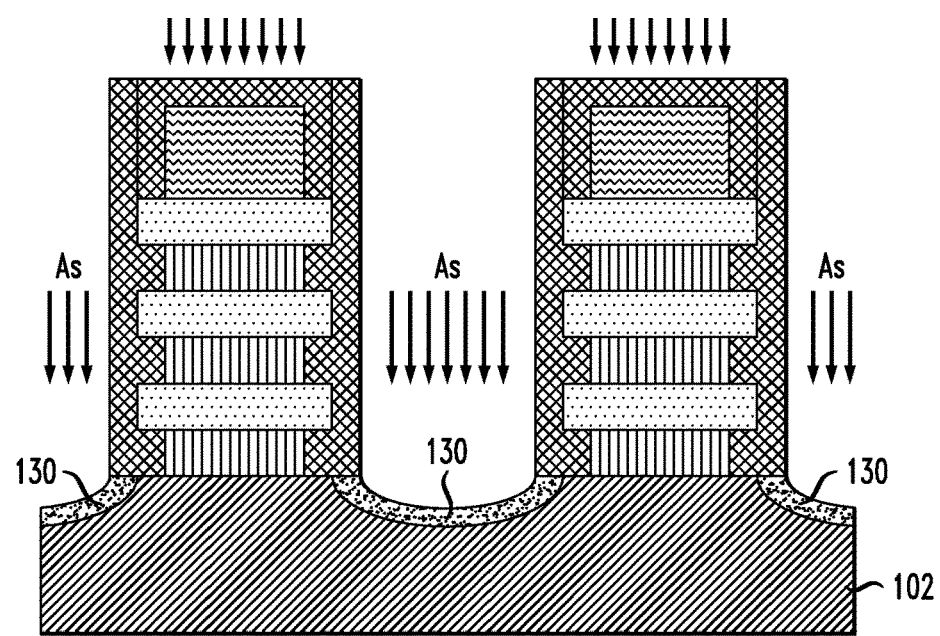
FIG. 6 is a schematic cross-sectional view illustrating low-energy plasma implantation of arsenic to exposed substrate surfaces, according to an embodiment of the invention.

FIG. 6 is a schematic cross-sectional view illustrating low-energy plasma implantation of arsenic (As) on the exposed portions of the substrate surface, according to an embodiment of the invention. Referring to FIG. 6, as shown by the arrows, a low-energy plasma implantation of arsenic (As) is performed. The arsenic (As) reacts with the exposed portions of the substrate 102 to poison the exposed surfaces of the recessed portions 115 of the substrate 102, and form arsenic (As) implanted surface regions 130. The portions of the structure covered by the spacer layer 120 and the inner spacer/liner layer 121 do not react with the arsenic (As) and are protected. As described further herein, the high arsenic concentration on the substrate surface 102 prevents bottom-up epitaxial growth from the substrate 102 during subsequent epitaxial growth of source/drain layers. In general, in accordance with embodiments of the present invention, arsenic is implanted for PFET and NFET devices. Alternatively, arsenic can be used for PFET devices, and boron can be used for NFET devices. Phosphorous may also be used instead of arsenic in some applications.

Figure 7:
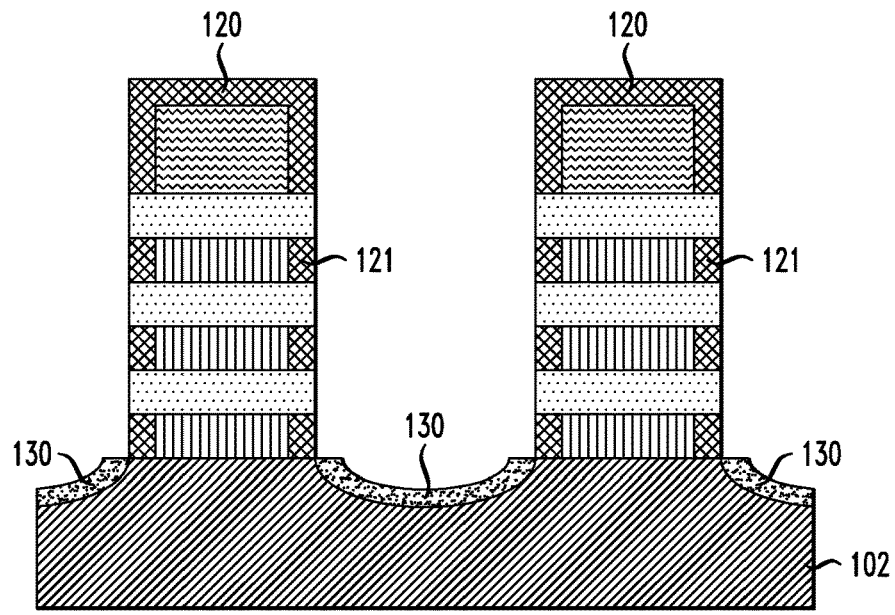
FIG. 7 is a schematic cross-sectional view illustrating etching of portions of the inner spacer/liner layer to expose silicon (Si) layers in the nanosheet stacks for epitaxial growth, according to an embodiment of the invention.

FIG. 7 is a schematic cross-sectional view illustrating etching of portions of the inner spacer/liner layer to expose silicon (Si) layers in the nanosheet stacks for epitaxial growth, according to an embodiment of the invention. As shown in FIG. 7, vertical portions of the inner spacer/liner layer 121 are removed to expose lateral sides of the silicon (Si) layers 105a-105c, so that epitaxial growth of source/drain layers can occur from the silicon (Si) layers 105a-105c. Portions of the inner spacer/liner layer 121 remain to cover the recessed lateral sides of the SiGe layers 107a-107c so that epitaxial growth does not occur from those layers. Removal of the vertical portions of the inner spacer/liner layer 121 can be performed using, for example, etching, such as a wet-etching process including, for example, a timed nitride etch using, for example, but not limited to, hot phosphoric acid.

Figure 8:
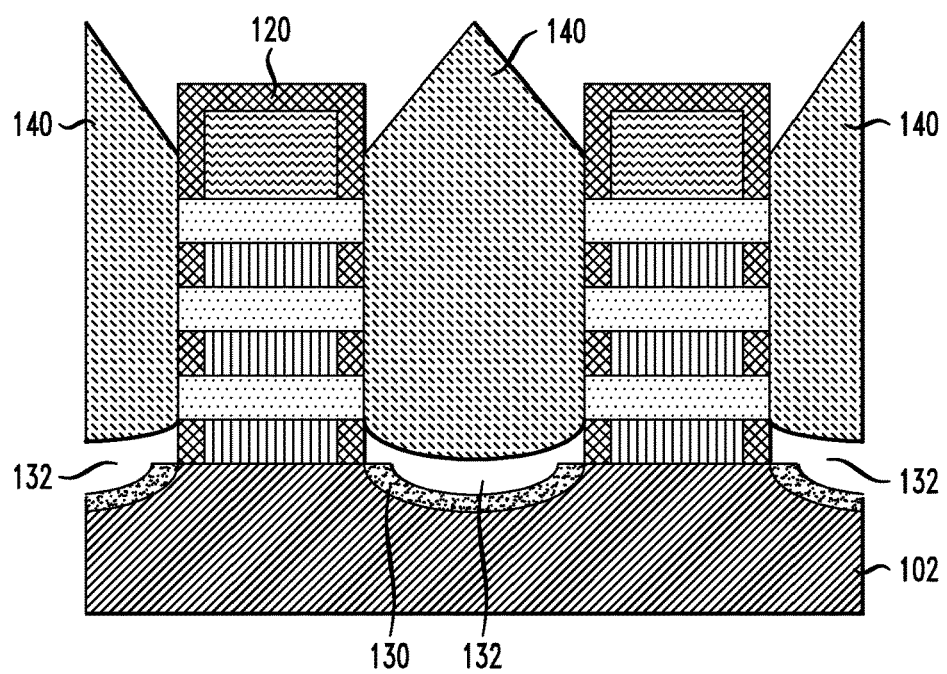
FIG. 8 is a schematic cross-sectional view illustrating epitaxial growth of source/drain layers, according to an embodiment of the invention.

FIG. 8 is a schematic cross-sectional view illustrating epitaxial growth of source/drain layers 140, according to an embodiment of the invention. As illustrated in FIG. 8, bottom-up epitaxial growth of source/drain layers 140 from the substrate 102 is prevented due to the presence of the arsenic implanted regions 130 on the substrate 102 surface. The arsenic implanted regions 130 create an incubation delay (up to several minutes, for example), and during that delay, epitaxial source/drain layers 140 are laterally grown from the exposed silicon layers 105a-105c of the patterned Si/SiGe stacks, but will not form at the bottom of the stacks due, for example, to gas depletion during growth. As further depicted in FIG. 8, gaps or spaces 132 are formed between the source/drain layers 140 and the arsenic implanted regions 130.

As noted herein above, prior to epitaxial growth, side portions of the SiGe layers 107a-107c are covered with remaining portions of the inner spacer/liner layer 121 during the epitaxial growth of the source/drain layers 140, and lateral epitaxial growth does not occur from the SiGe layers 107a-107c of the patterned stacks.

The epitaxial source/drain layers 140 become the source/drain regions for transistor devices, such as, for example, NFETs or PFETs, and can comprise in-situ phosphorous doped (ISPD) Si:C for n-type devices, or in-situ boron doped (ISBD) SiGe for p-type devices, at concentrations of about $1E19/cm^3$ to about $1E21/cm^3$.

Figure 9:
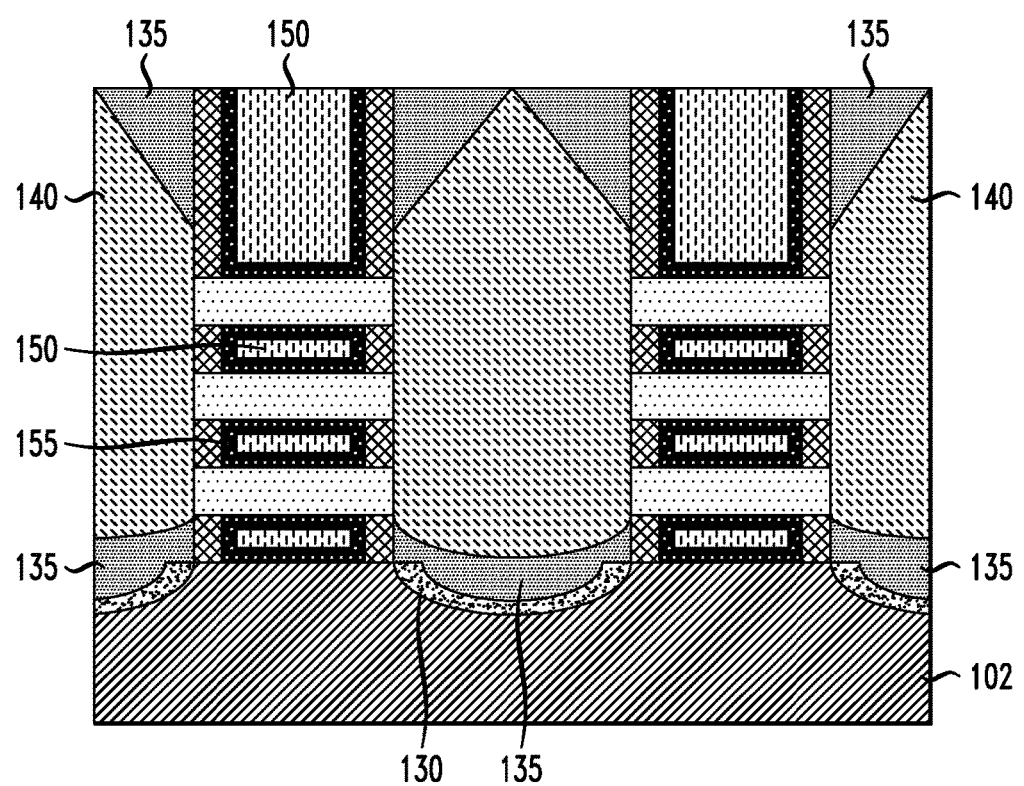
FIG. 9 is a schematic cross-sectional view illustrating a structure after inter-layer dielectric (ILD) deposition, planarization, and gate formation steps, according to an embodiment of the invention.

FIG. 9 is a schematic cross-sectional view illustrating a structure after inter-layer dielectric (ILD) deposition, planarization, and gate formation steps, according to an embodiment of the invention. As detailed herein, an embodiment of the invention such as depicted in FIG. 9 includes a nanosheet structure isolated from bottom-up source/drain epitaxy by the incubation delay caused by the arsenic treatment.

Referring to FIG. 9, an ILD layer 135, including, but not necessarily limited to, silicon dioxide ($SiO_2$), low-temperature oxide (LTO), high-temperature oxide (HTO), flowable oxide (FOX) or some other dielectric is deposited on the substrate 102 to fill in areas around the epitaxial source/drain layers 140 and in remaining spaces (e.g., in gaps 132) between the nanosheet stacks. The ILD layer 135 can be deposited using, for example, CVD, PECVD, RFCVD, PVD, ALD, MLD, MBD, PLD, LSMCD, and/or sputtering, followed by planarization by, for example, CMP.

The dummy gates 110 and SiGe layers 107a-107c are selectively removed. Then, the silicon nanosheets or nanowires 105a-105c are suspended, and the gate structure, including, for example, gate and dielectric portions 150, 155 are formed in place of the dummy gates 110 and SiGe layers 107a-107c. The selective removal can be performed using wet or dry chemistries selective to Si. In non-limiting examples, $CH_3COOH:H_2O_2:HF$ or $CF_4/O_2$ based chemistries can be used. Various other etch chemistries may be used.

In accordance with an embodiment of the present invention, the gate structures can each include a gate dielectric layer 155 such as, for example, a high-K dielectric layer including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum V oxide) or other electronic grade (EG) oxide. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. According to an embodiment, the gate structures 150 can each include a work-function metal (WFM) layer, including but not necessarily limited to, for a PFET, titanium nitride (TiN), tantalum nitride (TaN) or ruthenium (Ru), and for an NFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, which can be deposited on the gate dielectric layer 155. The gate structures 150 can also each further include a gate layer including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited on the WFM layer and the gate dielectric layer 155.

In one or more embodiments of the invention, the layers for the gate structures 150 can be deposited using, for example, CVD, PECVD, RFCVD, PVD, ALD, MLD, MBD, PLD, LSMCD, and/or sputtering, followed by planarization by, for example, CMP.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

The invention claimed is:

1. A method for manufacturing a semiconductor device, comprising:
    forming a stacked configuration of silicon germanium and silicon layers on a semiconductor substrate, wherein the stacked configuration comprises a repeating arrangement of a silicon layer stacked on a silicon germanium layer;
    patterning the stacked configuration into a plurality of patterned stacks spaced apart from each other;
    etching exposed sides of the silicon germanium layers to remove portions of the silicon germanium layers from lateral sides of each of the silicon germanium layers;
    covering, with a dielectric, exposed sides of the silicon layers, exposed sides of remaining portions of the silicon germanium layers, and portions of a surface of the semiconductor substrate adjacent the patterned stacks;
    removing the dielectric from the portions of the surface of the semiconductor substrate;
    implanting arsenic on the portions of the surface of the semiconductor substrate to form a plurality of arsenic implanted regions on the portions of the surface of the semiconductor substrate;
    etching the dielectric to expose lateral sides of each of the silicon layers in the plurality of patterned stacks; and
    growing a plurality of epitaxial source/drain layers adjacent the plurality of patterned stacks, wherein the epitaxial source/drain layers are grown from the exposed lateral sides of the silicon layers.

2. The method according to claim 1, wherein the removing of the dielectric from the portions of the surface of the semiconductor substrate comprises using a gas cluster ion beam (GCIB) process.

3. The method according to claim 1, wherein the implanting of the arsenic is performed using a plasma implantation process.

4. The method according to claim 1, wherein the growing of the plurality of epitaxial source/drain layers adjacent the plurality of patterned stacks is performed during a duration of time corresponding to an incubation delay caused by presence of the arsenic implanted regions on the portions of the surface of the semiconductor substrate.

5. The method according to claim 1, wherein the arsenic implanted regions prevent epitaxial growth from the portions of the surface of the semiconductor substrate.

6. The method according to claim 1, wherein at least part of the arsenic implanted regions are formed in a recessed portion of the substrate.

7. The method according to claim 1, wherein a plurality of gaps are formed between the plurality of epitaxial source/drain layers and the plurality of arsenic implanted regions on the portions of the surface of the semiconductor substrate.

8. The method according to claim 7, further comprising depositing an inter-layer dielectric layer in the plurality of gaps.

9. The method according to claim 1, further comprising:
    selectively removing the silicon germanium layers from the plurality of patterned stacks; and
    replacing the removed silicon germanium layers with respective gate structures.

10. The method according to claim 1, wherein a dummy gate is formed on each of the plurality of patterned stacks.

11. The method according to claim 10, further comprising replacing the dummy gate on each of the plurality of patterned stacks with a gate structure.

12. A method for manufacturing a semiconductor device, comprising:
    forming a stacked configuration of first and second semiconductor layers on a semiconductor substrate, wherein the stacked configuration comprises a repeating arrangement of a second semiconductor layer stacked on a first semiconductor layer;
    patterning the stacked configuration into a plurality of patterned stacks spaced apart from each other;
    covering, with a dielectric, exposed sides of the plurality of patterned stacks, and portions of a surface of the semiconductor substrate adjacent the patterned stacks;
    removing the dielectric from the portions of the surface of the semiconductor substrate;
    implanting an impurity on the portions of the surface of the semiconductor substrate to form a plurality of implanted regions on the portions of the surface of the semiconductor substrate, wherein the plurality of implanted regions at least one of delay and prevent epitaxial growth from the portions of the surface of the semiconductor substrate;
    etching the dielectric to expose lateral sides of each of the second semiconductor layers in the plurality of patterned stacks; and
    growing a plurality of epitaxial source/drain layers adjacent the plurality of patterned stacks, wherein the epitaxial source/drain layers are grown from the exposed lateral sides of the second semiconductor layers.

13. The method according to claim 12, wherein the impurity comprises arsenic.

14. The method according to claim 12, wherein the growing of the plurality of epitaxial source/drain layers adjacent the plurality of patterned stacks is performed during a duration of time corresponding to an incubation delay caused by presence of the implanted regions on the portions of the surface of the semiconductor substrate.

15. The method according to claim 12, wherein a plurality of gaps are formed between the plurality of epitaxial source/drain layers and the plurality of implanted regions on the portions of the surface of the semiconductor substrate.

16. The method according to claim 15, further comprising depositing an inter-layer dielectric layer in the plurality of gaps.

* * * * *